United States Patent
Park

(10) Patent No.: US 7,688,104 B2
(45) Date of Patent: Mar. 30, 2010

(54) ON-DIE TERMINATION DEVICE TO COMPENSATE FOR A CHANGE IN AN EXTERNAL VOLTAGE

(75) Inventor: Jung Hoon Park, Seoul (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 0 days.

(21) Appl. No.: 12/166,539

(22) Filed: Jul. 2, 2008

(65) Prior Publication Data

US 2009/0015290 A1    Jan. 15, 2009

(30) Foreign Application Priority Data

Jul. 3, 2007    (KR) .................. 10-2007-0066630

(51) Int. Cl.
    *H03K 17/16*    (2006.01)
(52) U.S. Cl. .................. 326/30; 326/21; 327/108
(58) Field of Classification Search .................. 326/30, 326/26, 21; 327/108
    See application file for complete search history.

(56) References Cited

U.S. PATENT DOCUMENTS 5,254,883 A * 10/1993 Horowitz et al. .............. 326/30
5,680,060 A * 10/1997 Banniza et al. ............... 326/30
6,545,522 B2 * 4/2003 Mughal et al. ............... 327/334
6,573,746 B2 * 6/2003 Kim et al. .................... 326/30
7,173,878 B2 * 2/2007 Kim ...................... 365/230.06
7,525,337 B2 * 4/2009 Park et al. .................... 326/30
2007/0153590 A1 * 7/2007 Seo et al. ................ 365/189.09

FOREIGN PATENT DOCUMENTS

| KR | 1020000021260 A | 4/2000 |
| KR | 2001-0026462 A | 4/2001 |
| KR | 1020040095912 A | 11/2004 |
| KR | 1020050118328 A | 12/2005 |

* cited by examiner

*Primary Examiner*—Vibol Tan
(74) *Attorney, Agent, or Firm*—Ladas & Parry LLP

(57) ABSTRACT

An on-die termination (ODT) control in a semiconductor memory device compensates for a change in an external voltage. The on-die termination device includes a voltage comparator that compares an external voltage to a set internal reference voltage. The compared values are sent to a controller that controls an on-die termination impedance value according to the output signal from the voltage comparator. Based on the output of the controller, the present invention spontaneously controls an on-die termination resistance value according to the change in the external voltage without degrading device characteristics during high-speed operation.

17 Claims, 3 Drawing Sheets

ON-DIE TERMINATION DEVICE TO COMPENSATE FOR A CHANGE IN AN EXTERNAL VOLTAGE

CROSS-REFERENCE TO RELATED APPLICATIONS

The present application claims priority to Korean patent application number 10-2007-0066630 filed on Jul. 3, 2007, which is incorporated herein by reference in its entirety.

BACKGROUND OF THE INVENTION

The present invention relates to a semiconductor memory device, and more particularly to an on-die termination (ODT) control.

A swing width of signals that interfaces between semiconductor memory devices is reduced as the semiconductor memory devices operate in higher speeds to minimize the delay time associated with transferring the signals. However, as the swing width of the signals is reduced, the influence of external noise is increased, and the signal reflection due to impedance mismatching at an interface becomes a critical problem.

Such impedance mismatching occurs due to external noise, fluctuations in the power supply voltage, changes in the operational temperature, changes in the manufacturing process, etc. When the impedance mismatching occurs, it is difficult to transmit data at high speeds, causing problems of distorted output data.

When the distorted output signal is transmitted, problems such as a setup/hold fail or misjudgment of an input level or the like can frequently occur at a receiving side.

In particular, in the electronic products utilizing dynamic random access memories (DRAM), the frequency of a signal bus is dramatically increased in order to realize high-speed operation. Therefore, efforts were made in the bus termination technology in the past to find ways to minimize the signal integrity distortions by solving the impedance mismatching problems. In an electronic system having a stub bus structure, using the on-die termination (ODT) was considered to be more advantageous for improving the signal integrity than using a motherboard termination (MBT).

On-die termination (ODT) means that the termination structure is implemented at an input/output port ("I/O port") of a memory mounted on a memory module. Consequently, the on-die termination (ODT) is an impedance matching circuit called the on-chip termination and is formed near a pad in a chip of an integrated circuit.

In a synchronous dynamic random access memory (SDRAM) having a double data rate type and other similar devices, the typical on-die termination (ODT) for impedance matching is achieved by connecting a resistor element having a fixed resistance value to the pad.

An on-die termination device as described above is configured as a pull-up resistor and a pull-down resistor. However, in the conventional on-die termination device, the on-die termination resistance values are unavoidably changed due to the changes in the external environment, and in order to compensate for the changed resistance values, the physical changes such as a changed option layer are required. These required physical changes are very inefficient as they relate to correction works on a processor.

There is also a problem in that the on-die termination resistance value become inadequate when there are changes in the external voltage, since the corrective work to change the external voltage is not performed. These problems degrade the characteristics of the input buffer, thereby degrading the overall efficiency of the device.

SUMMARY OF THE INVENTION

The present invention provides an on-die termination impedance control device capable of keeping an on-die termination resistance value consistent.

The present invention also provides a semiconductor device capable of performing high-speed operation through an on-die termination correction.

According to an embodiment of the present invention, there is provided an on-die termination device comprising a voltage comparator comparing external voltage and set internal reference voltage to provide an output signal and a controller controlling an on-die termination impedance value according to the output signal from the voltage comparator.

The voltage comparator outputs a high-level signal when the external voltage is higher than the reference voltage and outputs a low-level signal when the external voltage is lower than the reference voltage.

The controller performs a control that makes the on-die termination impedance value small when the external voltage is higher than the reference voltage and a control that makes the on-die termination impedance value large when the external voltage is lower than the reference voltage.

The voltage comparator comprises a first comparator that compares the external voltage and a first reference voltage and a second comparator that compares the external voltage and a second reference voltage.

The first comparator outputs a high-level signal when the external voltage is higher than the first reference voltage and outputs a low-level signal when the external voltage is lower than the first reference voltage.

The second comparator outputs a high-level signal when the external voltage is higher than the second reference voltage and outputs a low-level signal when the external voltage is lower than the second reference voltage.

The controller combines the output signals from the first comparator and the second comparator and on-die termination signals generated by the external instructions to control pull-up impedance and pull-down impedance of the on-die termination impedance.

The controller performs a control that turns-off all switching transistors for the pull-up impedance and the pull-down impedance of the on-die termination impedance when the external voltage is higher than the first reference voltage and the second reference voltage.

The controller performs a control that turns-off all the switching transistors for the pull-up impedance and the pull-down impedance of the on-die termination impedance when the external voltage is lower than the first reference voltage and the second reference voltage.

The controller performs a control that turns-on some of the switching transistors for the pull-up impedance and the pull-down impedance of the on-die termination impedance and turns-off the remaining switching transistors when the external voltage is in a value between the first reference voltage and the second reference voltage.

There is also provided an on-die termination device according to the present invention comprising: a voltage comparator that compares external voltage and reference voltage; on-die termination impedance including an impedance unit having a plurality of MOS transistors and passive resistor elements; and a controller that controls the on-die termination impedance value according to outputs from the voltage comparator.

The voltage comparator comprises a first comparator that compares the external voltage and a first reference voltage and a second comparator that compares the external voltage and a second reference voltage.

The controller combines the outputs of the first comparator and the second comparator and on-die termination activation signals to turn-on/turn-off transistors for the on-die termination impedance, thereby controlling the on-die termination impedance.

The controller comprises a first arithmetic unit that logically combines the on-die termination activation signals and the output signals from the first comparator and the second comparator, a second arithmetic unit that logically combines the on-die termination activation signals and the output signals from the first comparator and the second comparator, a first inverter that invertedly outputs the output signals from the first arithmetic unit, a second inverter that invertedly outputs the output signals from the second arithmetic unit, and a third inverter that invertedly outputs the on-die termination activation signals.

The first arithmetic unit comprises a first NAND arithmetic unit that uses the output signals from the first comparator and the second comparator as inputs; and a first NOR arithmetic unit that uses the output signals from the first NAND arithmetic unit and the inverted on-die termination activation signals as inputs.

The second arithmetic unit comprises a second NOR arithmetic unit that uses the output signals from the first comparator and the second comparator as inputs and a second NAND arithmetic unit that uses the on-die termination activation signals and the output signals from the second NOR arithmetic as inputs.

The output signals from the first arithmetic unit are inputted to any one of a plurality of PMOS transistors for the pull-up impedance as first pull-up signals, the output signals from the second arithmetic unit are inputted to any one transistor of a plurality of PMOS transistors for the pull-up impedance as second pull-up signals, and the outputs from the third inverter are inputted to the remaining PMOS transistors for the pull-up impedance.

The outputs from the first inverter are inputted to any one of a plurality of NMOS transistors for the pull-down impedance as first pull-up signals, the outputs from the second inverter are inputted to any one of the remaining NMOS transistors for the pull-down impedance as second pull-down signals, and the on-die termination activation signals are inputted to the remaining NMOS transistors for the pull-down impedance.

DESCRIPTION OF SPECIFIC EMBODIMENTS

Hereinafter, preferred embodiments and various configurations of the present invention will be described in detail with reference to the accompanying drawings.

Figure 1:
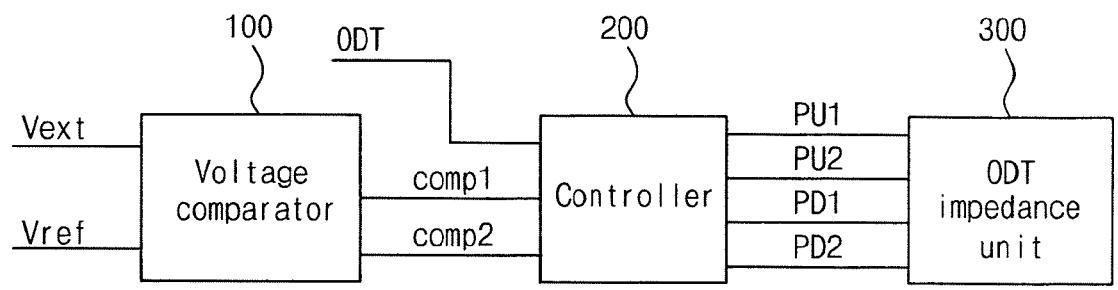
FIG. 1 is a block diagram of an on-die termination device according to an embodiment of the present invention.

FIG. 1 is an overall block view of an on-die termination (ODT) device according to an embodiment of the present invention.

Referring to FIG. 1, the on-die termination device includes a voltage comparator 100 that compares an external voltage Vext and a reference voltage Vref, a controller 200 that controls the on-die termination impedance by combining signals comp1 and comp2 outputted from the comparator and the on-die termination (ODT) signals, and an ODT impedance unit 300 that controls the overall impedance values according to control signals PU1, PU2, PD1, and PD2 from the controller.

The voltage comparator 100 compares the external voltage Vext and the reference voltage Vref and outputs a high-level signal when the external voltage Vext is higher than the reference voltage Vref and a low-level signal when the external voltage Vext is lower than the reference voltage Vref.

The controller 200 performs a control process that makes the overall impedance of the on-die termination impedance unit 300 large or small according to the output signals from the voltage comparator 100.

Figure 2:
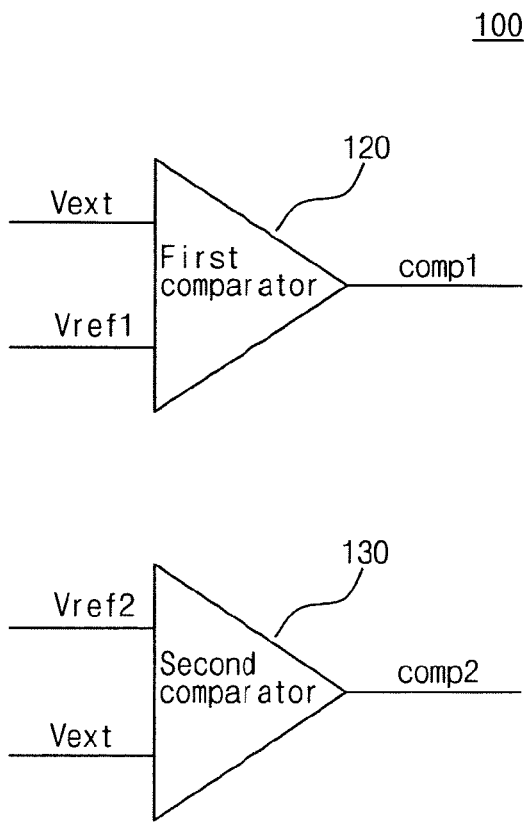
FIG. 2 shows detailed configuration of the voltage comparator 100 of FIG. 1.
Figure 3:
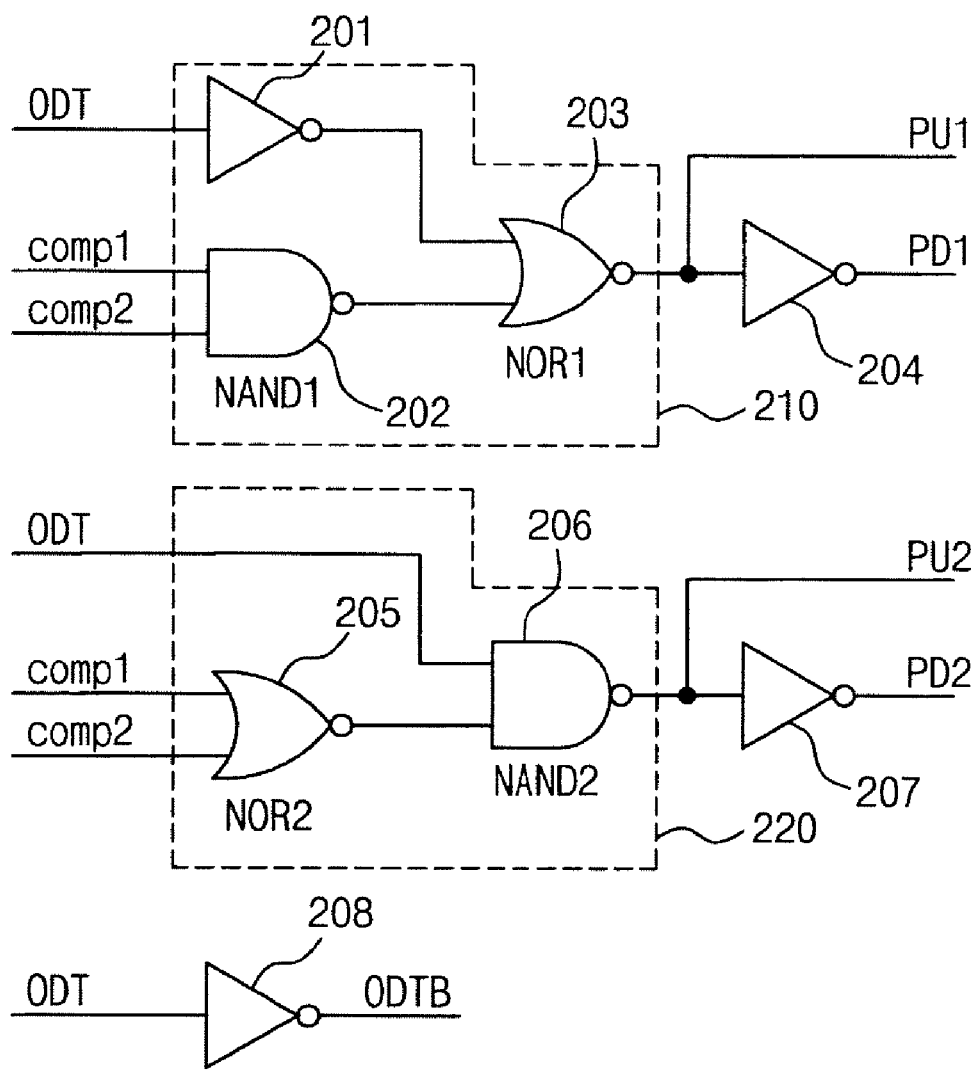
FIG. 3 shows detailed configuration of the controller 200 of FIG. 1.
Figure 4:
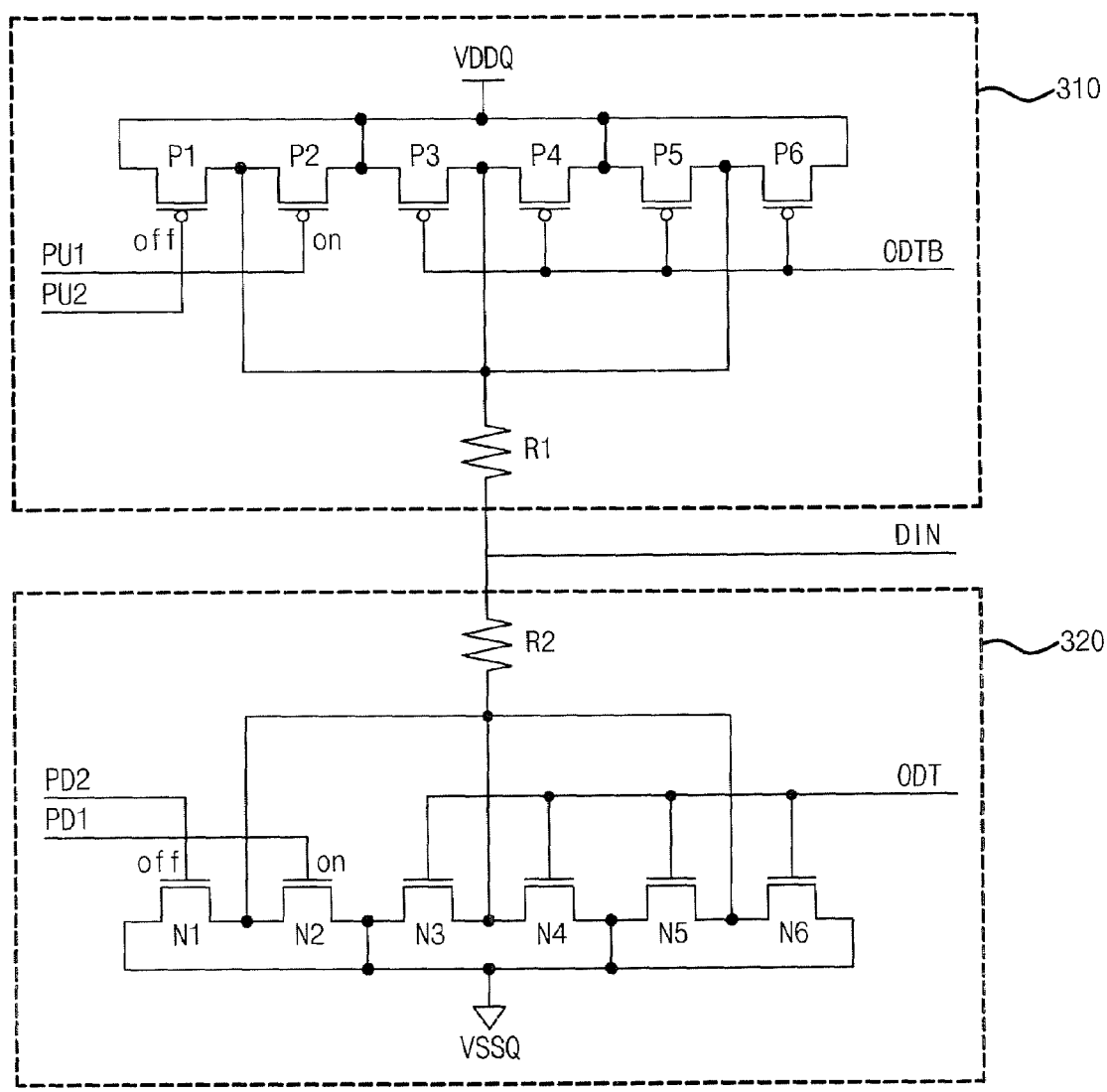
FIG. 4 shows detailed configuration of the on-die termination impedance unit 300 of FIG. 1.

FIGS. 2 to 4 show detailed configurations of FIG. 1. FIG. 2 is a detailed configuration view of the voltage comparator 100, FIG. 3 is a detailed configuration view of the controller 200, and FIG. 4 is a detailed configuration view of the ODT impedance unit 300.

Referring to FIG. 2, the voltage comparator 100 includes a first comparator 120 and a second comparator 130.

The first comparator 120 compares an external voltage Vext and a first reference voltage Vref1 to output a high (H)-level signal when the external voltage Vext is higher than the first reference voltage Vref1 and to output a low (L)-level signal when the external voltage Vext is lower than the first reference voltage Vref1.

The second comparator 130 compares the external voltage Vext and a second reference voltage Vref2 to output a high (H)-level signal when the external voltage Vext is higher than the second reference voltage Vref2 and to output a low (L)-level signal when the external voltage Vext is lower than the second reference voltage Vref2.

The first reference voltage Vref1 and the second reference voltage Vref2 are voltages generated inside the circuit (not shown). The configuration and operation of a reference voltage generator are well known in the related field of this application and therefore, a detailed description thereof will be omitted.

The first reference voltage Vref1 and the second reference voltage Vref2 have a slight potential difference, but this difference value can optionally be set by a designer. If a designer wants to design the reference voltages to react sensitively to the change in external voltage, the potential difference between both reference voltages is set small. If a designer wants to design the reference voltages to react insensitively to the change in external voltage, the potential difference between both reference voltages is set large.

Referring to FIG. 3, the controller 200 combines the outputs of the comparator 100, i.e., comp1 and comp2, and the on-die termination activation signals (ODT) to output control signals capable of controlling the pull-up impedance and the pull-down impedance.

The control unit 200 includes a first arithmetic unit 210 and a second arithmetic unit 220 that logically combine the on-die termination activation signals and the output signals from the comparators. The control unit 200 also includes a first inverter 204 that outputs the inverse of the output signals from the first arithmetic unit 210, a second inverter 207 that outputs the inverse of the output signals from the second arithmetic unit 220, and a third inverter 208 that outputs the inverse of the on-die termination activation signals (ODT).

The first arithmetic unit 210 includes a first inverter 201 that inverts the on-die termination activation signals, a first NAND gate 202 that performs a NAND operation using the output signals comp1 and comp2 from the first comparator and the second comparator as inputs, and a first NOR gate 203 that performs a NOR operation using the output signals from the first inverter 201 and the first NAND gate 202 as inputs.

The second arithmetic unit 220 includes a second NOR gate 205 that performs a NOR operation using the output signals comp1 and comp2 from the first and the second comparator as inputs and a second NAND gate 206 that performs a NAND operation using the on-die termination activation signals (ODT) and the output signals from the second NOR gate 205 as inputs.

The output signal from the first arithmetic unit 210 is a first pull up control signal PU1 to control the on/off of a PMOS transistor for the pull up impedance.

The output signal from the first inverter 204 is a first pull down control signal PD1 to control the on/off of a PMOS transistor for the pull down impedance.

The output signal from the second arithmetic unit 220 is a second pull up control signal PU1 to control the on/off of a PMOS transistor for the pull up impedance.

The output signal from the second inverter 207 is a second pull down control signal PD2 to control the on/off of a PMOS transistor for the pull down impedance.

Referring to FIG. 4, an ODT impedance unit 300 includes a pull up impedance unit 310 and a pull down impedance unit 320.

The pull up impedance unit 310 includes a plurality of transistors P1~P6 and a passive resistor element R1, and the pull down impedance unit 320 includes a plurality of NMOS transistors N1~N6 and a passive resistor element R2.

A first pull up control signal PU1 is applied to the gate terminal of a second PMOS transistor P2 of the pull up impedance unit 310, a second pull up control signal PU2 is applied to the gate terminal of a first PMOS transistor Pt, and an inverted on-die termination (ODT) activation signal (ODTB) is applied to the gate terminals of remaining transistors P3 to P6.

A first pull down control signal PD1 is applied to the gate terminal of a second NMOS transistor N2 of the pull down impedance unit 320, a second pull down control signal PD1 is applied to the gate terminal of a first NMOS transistor N1, and an inverted on-die termination (ODT) activation signal (ODTB) is applied to the gate terminals of remaining transistors N3 to N6.

The reference numeral DIN represents an input/output pin.

As structured as described above, the controller 200 turns off the transistors P1, P2, N1, and N2, performing a switching function, to make the entire impedance small when both the outputs of the first comparator 110 and the second comparator 120 are high, i.e., when an external voltage is higher than the first reference voltage and the second reference voltage.

In contrast, the controller 200 turns on the transistors P1, P2, N1, and N2 to make the entire impedance large when both the outputs comp1 and comp2 of the comparators are low.

Hereinafter, the operation of the on die termination device to control the on die termination impedance will be described in more detail, with reference to the drawings.

First, where the external voltage is higher than the first reference voltage and the second reference voltage generated internally will be described.

As described above, when the external voltage is higher than the first reference voltage and the second reference voltage, both the output comp1 of the first comparator 120 and the output comp2 of the second comparator 130 are at a high level. The output signals are inputted to the first NAND gate 202 and the second NOR gate 205 of the controller 200.

The output signals comp1 and comp2 are combined via the first NAND gate 202. The output of the first NAND gate 202 and the inverted ODT activation signal ODTB are combined via the first NOR gate 203 so that the output signal of the first NOR gate 203 becomes the first pull up control signal PU1 when at a high level. The output of the first NOR gate 203 becomes the first pull down control signals PD1 when at a low level and passed through the second inverter 204.

The first pull up control signal PU1 and the first pull down control signal PD1 are applied to the second PMOS transistor P2 for the pull-up impedance and the second NMOS transistor N2 for the pull-down impedance, respectively, to turn off the transistors P2 and N2.

The output signals comp1 and comp2 are also combined via a second NOR gate 205. The output of the second NOR gate 205 and the inverted ODT activation signal are combined via the second NAND gate 206 so that the output signal of the second NAND gate 206 becomes the second pull up control signal PU2 when at a low level. The output of the second NAND gate 206 becomes the second pull down control signals PD2 when at a high level and passed through the third inverter 207.

The second pull up control signal PU2 and the second pull down control signal PD2 are applied to the first PMOS transistor P1 for the pull-up impedance and the first NMOS transistor N1 for the pull-down impedance, respectively, to turn off the transistors P1 and N1.

According to the method as described above, when the external voltage Vext is higher than the reference voltages Vref1 and Vref2, the transistors P1, P2, N1, and N2 of the on die termination impedance unit 300 are turned off so that the entire impedance is reduced.

In the same manner, when the external voltage Vext is lower than the reference voltages Vref1 and Vref2, the transistors P1, P2, N1, and N2 of the on die termination impedance 300 are turned-on and turn-on resistors of the transistors are added so that the entire impedance is increased.

TABLE 1 represents logic values of the controller 200 according to the outputs comp1 and comp2 of the comparators.

| comp1 | comp2 | PU1 | PU2 | PD1 | PD2 |
|-------|-------|-----|-----|-----|-----|
| H | H | H | H | L | L |
| H | L | L | H | H | L |
| L | H | L | H | H | L |
| L | L | L | L | H | H |

Where the external voltage Vext has a value between the first reference voltage Vref1 and the second reference voltage Vref2, with reference to the above table 1, one of the output signals comp1 and comp2 of the comparators has a high H level and the other output signal has a low L level.

In the case where the external voltage Vext is similar to the internal reference voltages, the variation of the external voltage applied is less and the variation of the on die termination impedance values is also less so that the output signal comp1 of the first comparator 120 and the output signal comp2 of the second comparator 130 will output at a high and low level, or at a low and high level. Therefore, the first pull up control signal PU1 and the first pull down control signal PD1 of the controller 200 become a low and high level, respectively.

Accordingly, the second pull up control signal PU2 and the second pull down control signal PD2 of the controller 200 become a high and low level, respectively.

Therefore, the first PMOS transistor P1 of the pull up impedance unit 310 is turned off and the second PMOS transistor P2 thereof is turned on. Also, the first NMOS transistor N1 of the pull down impedance unit 320 is turned off and the second NMOS transistor N2 thereof is turned on.

Therefore, the present invention can control an on-die termination resistance value according to a change in the external voltage.

The present invention can also spontaneously control an on-die termination resistance value so as not to degrade device characteristics during high-speed operation.

Those skilled in the art will appreciate that the specific embodiments disclosed in the foregoing description may be readily utilized as a basis for modifying or designing other embodiments for carrying out the same purposes of the present invention. Those skilled in the art will also appreciate that such equivalent embodiments do not depart from the spirit and scope of the invention as set forth in the appended claims.

What is claimed is:

1. An on-die termination device, comprising:
    a voltage comparator comparing an external voltage and a set internal reference voltage to provide an output signal; and
    a controller controlling an on-die termination impedance value according to the output signal from the voltage comparator,
    wherein the controller performs a control process that makes the on-die termination impedance value small when the external voltage is higher than the reference voltage and a control process that makes the on-die termination impedance value large when the external voltage is lower than the reference voltage.

2. The on-die termination device as set forth in claim 1, wherein the voltage comparator outputs a high-level signal when the external voltage is higher than the reference voltage and outputs a low-level signal when the external voltage is lower than the reference voltage.

3. The on-die termination device as set forth in claim 1, wherein the voltage comparator comprises:
    a first comparator that compares the external voltage and a first reference voltage and outputs a signal; and
    a second comparator that compares the external voltage and a second reference voltage and outputs a signal.

4. The on-die termination device as set forth in claim 3, wherein the first comparator outputs a high-level signal when the external voltage is higher than the first reference voltage and outputs a low-level signal when the external voltage is lower than the first reference voltage.

5. The on-die termination device as set forth in claim 3, wherein the second comparator outputs a high-level signal when the external voltage is higher than the second reference voltage and outputs a low-level signal when the external voltage is lower than the second reference voltage.

6. The on-die termination device as set forth in claim 3, wherein the controller combines the output signals from the first comparator and the second comparator and on-die termination signals generated by external instructions to control a pull-up impedance and a pull-down impedance of the on-die termination impedance value.

7. The on-die termination device as set forth in claim 3, wherein the controller performs a control process that turns-off all switching transistors for a pull-up impedance and a pull-down impedance of the on-die termination impedance value when the external voltage is higher than the first reference voltage and the second reference voltage.

8. The on-die termination device as set forth in claim 3, wherein the controller performs a control process that turns-off all switching transistors for a pull-up impedance and a pull-down impedance of the on-die termination impedance value when the external voltage is lower than the first reference voltage and the second reference voltage.

9. The on-die termination device as set forth in claim 3, wherein the controller performs a control process that turns-on some of a plurality of switching transistors for a pull-up impedance and a pull-down impedance of the on-die termination impedance value and turns-off the remaining plurality of switching transistors when the external voltage has a value between the first reference voltage and the second reference voltage.

10. An on-die termination device, comprising:
    a voltage comparator comparing an external voltage and a reference voltage to provide an output signal;
    an on-die termination impedance generated by an impedance unit having a plurality of MOS transistors and a plurality of passive resistor elements; and
    a controller controlling the on-die termination impedance according to the output signal from the voltage comparator,
    wherein the controller performs a control process that makes the on-die termination impedance value small when the external voltage is higher than the reference voltage and a control process that makes the on-die termination impedance value large when the external voltage is lower than the reference voltage.

11. The on-die termination device as set forth in claim 10, wherein the voltage comparator comprises:
    a first comparator that compares the external voltage and a first reference voltage and outputs a signal; and
    a second comparator that compares the external voltage and a second reference voltage and outputs a signal.

12. The on-die termination device as set forth in claim 11, wherein the controller combines the outputs of the first comparator and the second comparator and on-die termination activation signals to turn-on/turn-off the transistors for the on-die termination impedance unit, thereby controlling the on-die termination impedance.

13. The on-die termination device as set forth in claim 11, wherein the controller comprises:
    a first arithmetic unit that logically combines on-die termination activation signals and the output signals from the first comparator and the second comparator and outputs a signal;
    a second arithmetic unit that logically combines the on-die termination activation signals and the output signals from the first comparator and the second comparator and outputs a signal;
    a first inverter that outputs the inverse of the output signal from the first arithmetic unit;
    a second inverter that outputs the inverse of the output signal from the second arithmetic unit; and
    a third inverter that outputs the inverse of the on-die termination activation signals.

14. The on-die termination device as set forth in claim 13, wherein the first arithmetic unit comprises:
    a first NAND arithmetic unit that uses the output signals from the first comparator and the second comparator as inputs; and
    a first NOR arithmetic unit that uses the output signal from the first NAND arithmetic unit and the inverted on-die termination activation signals as inputs.

15. The on-die termination device as set forth in claim 13, wherein the second arithmetic unit comprises:
- a second NOR arithmetic unit that uses the output signals from the first comparator and the second comparator as inputs; and
- a second NAND arithmetic unit that uses the on-die termination activation signals and the output signal from the second NOR arithmetic unit as inputs.

16. The on-die termination device as set forth in claim 13, wherein the output signal from the first arithmetic unit is inputted to any one of a plurality of PMOS transistors for a pull-up impedance as a first pull-up signal, the output signal from the second arithmetic unit is inputted to any one of the remaining PMOS transistors for the pull-up impedance as a second pull-up signal, and the output from the third inverter is inputted to the remaining PMOS transistors for the pull-up impedance.

17. The on-die termination device as set forth in claim 13, wherein the output from the first inverter is inputted to any one of a plurality of NMOS transistors for a pull-down impedance as a first pull-down signal, the output from the second inverter is inputted to any one of the remaining NMOS transistors for the pull-down impedance as a second pull-down signal, and the on-die termination activation signals are inputted to the remaining NMOS transistors for the pull-down impedance.

\* \* \* \* \*